(12) United States Patent
Chatwin et al.

(10) Patent No.: US 8,633,776 B2
(45) Date of Patent: Jan. 21, 2014

(54) SYSTEM AND METHOD FOR EFFECTIVELY PERFORMING A CLOCK SIGNAL DISTRIBUTION PROCEDURE

(75) Inventors: Jeremy Chatwin, Santa Cruz, CA (US); Bernard J. Griffiths, Ben Lomond, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 141 days.

(21) Appl. No.: 11/903,710

(22) Filed: Sep. 24, 2007

(65) Prior Publication Data

US 2008/0169888 A1 Jul. 17, 2008

Related U.S. Application Data

(60) Provisional application No. 60/881,065, filed on Jan. 17, 2007.

(51) Int. Cl.
*H03B 5/08* (2006.01)
*H03B 5/18* (2006.01)

(52) U.S. Cl.
USPC ...... 331/167; 331/36 C; 331/109; 331/117 R; 331/117 FE; 331/177 V

(58) Field of Classification Search
USPC ........... 331/109, 117 R, 117 FE, 177 V, 36 C, 331/167
See application file for complete search history.

(56) References Cited

U.S. PATENT DOCUMENTS 5,483,204 A * 1/1996 Tanoi .............................. 331/14
5,629,838 A * 5/1997 Knight et al. .................. 361/782
5,686,849 A   11/1997 Burzio
5,734,285 A * 3/1998 Harvey ......................... 327/291
5,856,763 A * 1/1999 Reeser et al. .................... 331/49
6,504,443 B1 * 1/2003 Eguizabal ................. 331/177 V
6,535,037 B2 * 3/2003 Maligeorgos ................. 327/116
6,738,922 B1   5/2004 Warwar et al.
6,856,169 B2 * 2/2005 Frans et al. ...................... 326/82
6,909,336 B1 * 6/2005 Rajagopalan et al. ........ 331/183
7,015,768 B1 * 3/2006 Talwalkar ................. 331/177 V
7,019,597 B2 * 3/2006 Gutierrez .................. 331/117 R (Continued)

FOREIGN PATENT DOCUMENTS

EP           1742359 A1    10/2007
WO     WO2005099164 A1    10/2005

OTHER PUBLICATIONS

Hyung-Rok Lee, et al., A 1.2-V-Only 900-mW 10Gb Ethernet Transceiver and XAUI Interface With Robust VCO Tuning Technique, IEEE Journal of Solid-State Circuits, vol. 40, No. 11, Nov. 2005, pp. 2148-2158.

(Continued)

*Primary Examiner* — Arnold Kinkead
*Assistant Examiner* — Richard Tan
(74) *Attorney, Agent, or Firm* — Gregory J. Koerner; Redwood Patent Law

(57) ABSTRACT

A system and method for effectively performing a clock signal distribution procedure includes a clock generator configured to generate one or more clock signals that include electronic timing information. A clock load utilizes the electronic timing information from the clock signals to synchronize appropriate system processes. Capacitive coupling means are provided in a series configuration for transferring the clock signals from the clock generator to the clock load in accordance with an alternating-current direct-drive technique.

23 Claims, 8 Drawing Sheets

(56) References Cited

U.S. PATENT DOCUMENTS

| | | | |
|---|---|---|---|
| 7,061,337 B2* | 6/2006 | Partovi et al. | 331/109 |
| 7,098,753 B1* | 8/2006 | Dumitrescu et al. | 331/182 |
| 7,116,183 B2* | 10/2006 | Wu | 331/176 |
| 7,301,412 B2* | 11/2007 | Moribe et al. | 331/177 V |
| 7,383,373 B1* | 6/2008 | Strickland | 710/315 |
| 2003/0003887 A1* | 1/2003 | Lim et al. | 455/147 |
| 2003/0122669 A1* | 7/2003 | Filippov et al. | 340/563 |
| 2003/0200518 A1* | 10/2003 | Saeki | 716/6 |
| 2005/0212611 A1* | 9/2005 | Muthali et al. | 331/117 R |
| 2005/0242897 A1* | 11/2005 | Lim et al. | 331/179 |
| 2007/0058753 A1* | 3/2007 | Saavedra et al. | 375/329 |
| 2007/0064837 A1 | 3/2007 | Meltzer | |

OTHER PUBLICATIONS

Yido Koo et al., A Fully Integrated CMOS Frequency Synthesizer With Charge-Averaging Charge Pump and Dual-Path Loop Filter for PCS-and Cellular-CDMA Wireless Systems, IEEE Journal of Solid-State Circuits, vol. 37, No. 5, May 2002, pp. 536-542.

Gerrit Van Werven, et al, System Laboratory Eindhoven, The Netherlands, An 99040 TEA684x Family A Nice Radio for New in Car Entertainment, Version 2.0, www.nxp.com/acrobat_download/applicationnotes/AN99040_2.pdf, Nov. 1, 2004, pp. 1-55.

* cited by examiner

SYSTEM AND METHOD FOR EFFECTIVELY PERFORMING A CLOCK SIGNAL DISTRIBUTION PROCEDURE

CROSS-REFERENCE TO RELATED APPLICATION

This Application claims priority in U.S. Provisional Patent Application No. 60/881,065 entitled "Dual Mode Loop Filter Connection For A Bang-Bang PLL," that was filed on Jan. 17, 2007. The foregoing related Application is commonly owned, and is hereby incorporated by reference.

BACKGROUND SECTION

1. Field of the Invention

This invention relates generally to techniques for implementing electronic devices, and relates more particularly to a system and method for effectively performing a clock signal distribution procedure.

2. Description of the Background Art

Providing effective techniques for implementing electronic devices is a significant consideration for designers and manufacturers of contemporary electronic systems. However, effectively implementing electronic devices may create substantial challenges for system designers. For example, enhanced demands for increased device functionality and performance may require more system processing resources or require additional hardware resources. An increase in processing or hardware requirements may also result in a corresponding detrimental economic impact due to increased production costs and operational inefficiencies.

Furthermore, enhanced device capability to perform various advanced operations may provide additional benefits to a system user, but may also place increased demands on the control and management of various system components. For example, an enhanced electronic device that requires synchronizing clock signals for multiple different electronic components may benefit from an effective implementation because of the complexity and timing requirements of the electronic circuitry that may be involved.

Due to growing demands on system resources and substantially increasing circuit complexity, it is apparent that developing new techniques for implementing and utilizing electronic devices is a matter of concern for related electronic technologies. Therefore, for all the foregoing reasons, developing effective techniques for implementing and utilizing electronic devices remains a significant consideration for designers, manufacturers, and users of contemporary electronic systems.

SUMMARY

In accordance with the present invention, a system and method are disclosed for effectively performing a clock signal distribution procedure. In accordance with one embodiment of the present invention, an AC-coupled direct-drive clock circuit includes, but is not limited to, a clock generator (a voltage-controlled oscillator (VCO) core plus an LC tank), two series coupling capacitors, certain parasitic capacitances associated with electrical conductors, and a clock load.

In certain embodiments, the LC tank comprises an inductor, a fixed capacitor, and a variable capacitor. The LC tank is driven by the VCO core which excites the LC tank by injecting energy to replace energy dissipated by the finite tank Q and so maintains the clock signal oscillation. In certain embodiments, the LC tank outputs a differential signal (a tank signal and a corresponding inverted tankb signal) to respective coupling capacitors. The clock load (one or more functional blocks) has an effective load capacitance which includes the actual load capacitance and the parasitic wiring capacitances. One of the coupling capacitors provides the tank signal to the clock load as a clk signal, and the other coupling capacitor provides the tankb signal to the clock load as a clkb signal.

In accordance with the present invention, the AC-coupled direct-drive clock circuit retains the advantages of direct drive including reduced power consumption and reduced timing uncertainty. In addition, the AC-coupled direct-drive clock circuit also offers the advantages of reducing the reverse coupling to the LC tank, and reducing the effect of the load and distribution capacitances on the oscillation frequency. Furthermore, the AC-coupled direct-drive clock circuit allows independent control of the clock signal amplitude and common mode voltage.

In particular, the utilization of the AC coupling capacitors creates a capacitive voltage divider that steps down an LC tank voltage (Vtank) to produce a clock load voltage (Vclk). This reduced voltage swing of the clk signal and the clkb signal is more suitable for the functional blocks of the clock load. In addition, the AC coupling capacitors allow the clk signal and clkb signal to be set to any arbitrary common mode voltage. The common mode voltage may be set to be suitable for the functional blocks independent of the VCO core common-mode voltage.

In accordance with the present invention, reverse coupling back into the LC tank is advantageously reduced by the series coupling capacitors because any voltage disturbances from the clock load are reduced by the capacitive divider. This capacitive divider action of the coupling capacitors also reduces the contribution of the effective clock load capacitance upon the LC tank capacitance. For all of the foregoing reasons, the present invention therefore provides an improved system and method for effectively performing a clock signal distribution procedure.

DETAILED DESCRIPTION

The present invention relates to an improvement in signal distribution techniques. The following description is presented to enable one of ordinary skill in the art to make and use the invention, and is provided in the context of a patent application and its requirements. Various modifications to the disclosed embodiments will be readily apparent to those skilled in the art, and the generic principles herein may be applied to other embodiments. Thus, the present invention is not intended to be limited to the embodiments shown, but is to be accorded the widest scope consistent with the principles and features described herein.

The present invention is described herein as a system and method for effectively performing a clock signal distribution procedure, and includes a clock generator configured to generate one or more clock signals that include electronic timing information. Functional blocks forming a clock load utilize the electronic timing information from the clock signals to synchronize appropriate system processes. Coupling capacitors are provided in a series configuration for transferring the clock signals from the clock generator to the clock load in accordance with an alternating-current direct-drive technique.

Figure 1:
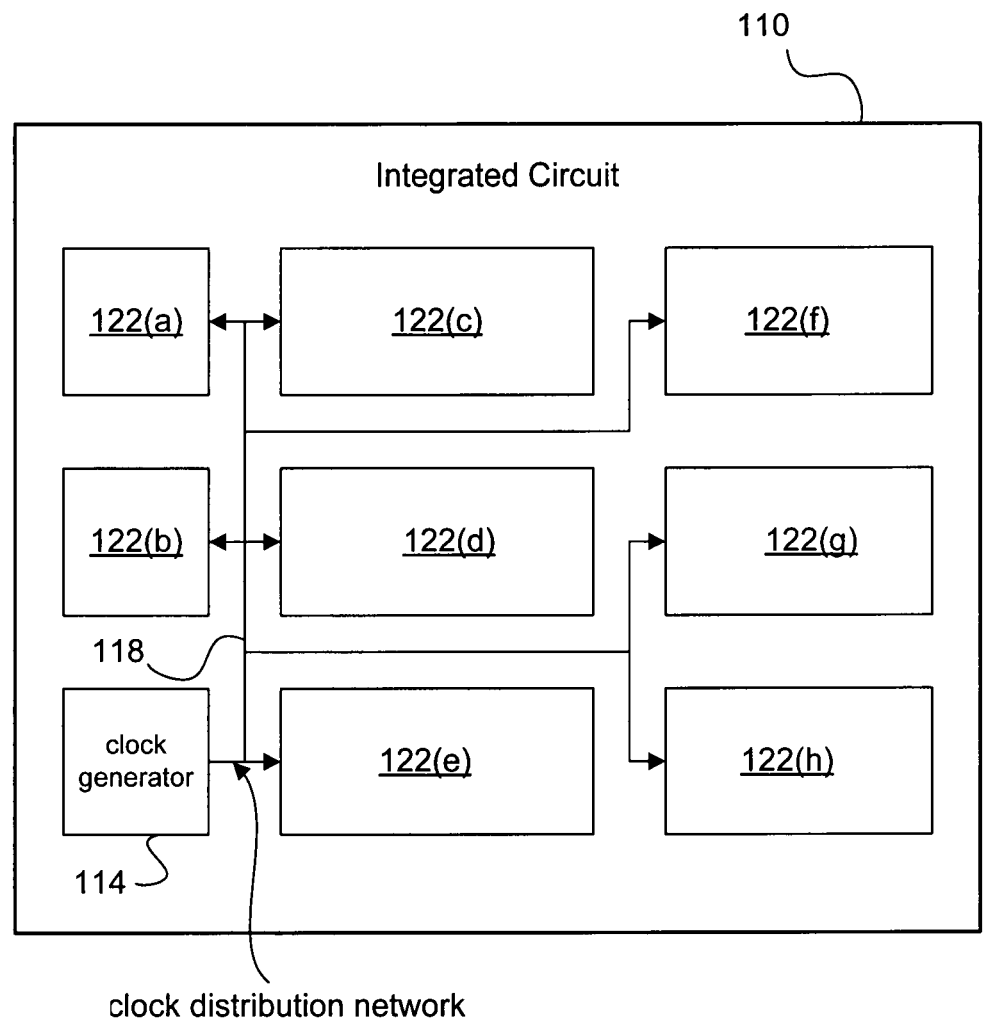
FIG. 1 is a block diagram for one embodiment of an integrated circuit device.

Referring now to FIG. 1, a block diagram of an integrated circuit 110 is shown, in accordance with one embodiment of the present invention. The FIG. 1 embodiment is presented for purposes of illustration, and in alternate embodiments, integrated circuit 110 may be implemented using components and configurations in addition to, or instead of, certain of those components and configurations discussed in conjunction with the FIG. 1 embodiment.

In the FIG. 1 embodiment, integrated circuit 110 includes a clock generator 114 that provides a clock signal to various functional blocks 122(a) through 122(h) via a clock distribution network 118. The functional blocks 122 perform processes that may require communication between themselves and the outside of integrated circuit 110. The clock generator 114 generates a universal clock that is passed via clock distribution network 118 to each respective functional block 122. With each functional block 122 having access to this universal clock, inter-block and off-chip communication may be readily achieved.

In the FIG. 1 embodiment, clock generator 114 may be implemented to include a voltage controlled oscillator (VCO). VCOs are important components of many electronic clock generation systems. In many applications, a VCO may be part of a feedback loop used to provide accurate timing information. Critical system performance metrics depend on the accuracy and stability of the timing information provided by these VCOs. The timing information is often used by a multitude of functional blocks 122 within a system. The clock distribution may be complex and the load on the physical timing-signal wires is often quite high.

These functional blocks 122 may have other input signals that are asynchronous to the VCO timing signal, and so asynchronous disturbances may be reverse-coupled through the clock distribution network 118 to other functional blocks 122, causing the timing information accuracy to be reduced. Finally, power dissipation is always an important consideration. Therefore, a summary of the some of the significant issues in a VCO-based clock distribution system are: 1). Distribution complexity and loading, 2). Timing accuracy and variation (phase noise and jitter),
3). Reverse isolation, and 4). Power dissipation.

Systems requiring a relatively high frequency (for example, in the GHz range) and a relatively narrow range of target frequencies (for example, less than 30% variation) may use a VCO employing some form of resonator, such as a simple LC tank. The phase noise of this kind of VCO is usually significantly better than other types of non-resonant VCOs. The reduced phase noise typically translates into reduced jitter and improved timing accuracy. The FIG. 1 embodiment is presented in the context of an integrated circuit environment, however in alternate embodiments, the present invention may be utilized in conjunction with any desired electronic configurations, components, devices, or networks.

The present invention describes a direct drive technique for clock distribution that subsumes the capacitive clock loads into the LC tank of an LC-VCO. The clock load is connected to the LC tank with series coupling capacitors to form a capacitive divider with the effective load capacitance. This capacitive divider causes the clock load capacitance to exhibit less of a load on the LC tank, reduces the clock amplitude, and reduces the coupling of noise back into the LC tank. This alternating current (AC) direct-drive scheme also eliminates the requirement for clock buffers and therefore offers significant power conservation. The implementation and utilization of the FIG. 1 electronic system 110 is further discussed below in conjunction with FIGS. 2-8.

Figure 2A:
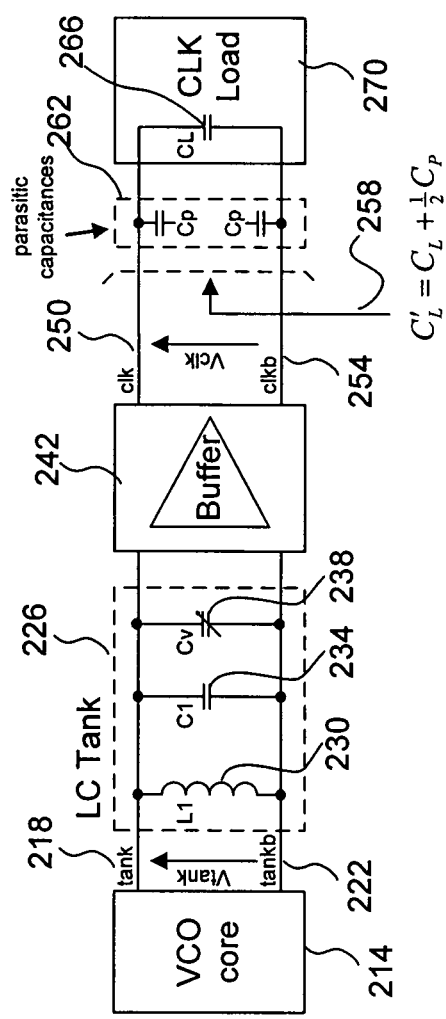
FIG. 2A is a schematic diagram for one embodiment of a buffered clock circuit.

Referring now to FIG. 2A, a schematic diagram for one embodiment of a buffered clock circuit 210 is shown. In the FIG. 2A embodiment, buffered clock circuit 210 includes, but is not limited to, a clock generator (VCO core 214 plus LC tank 226), a buffer 242, certain parasitic capacitances 262 associated with wiring over some distance, and a clock (CLK) load 270. In alternate embodiments, buffered clock circuit 210 may be implemented using components and configurations in addition to, or instead of, certain of those components and configurations discussed in conjunction with the FIG. 2A embodiment.

In the FIG. 2A embodiment, the clock generator frequency may be variable so that it can be adjusted to synchronize with other devices. In this case, the clock generator may be termed a voltage controlled oscillator (VCO). One particular type of VCO uses a resonant network (the LC tank 226) to define its operating frequency. In the FIG. 2A embodiment, the VCO comprises VCO core 214 and LC tank 226. The VCO core 214 comprises active circuitry to initialize and sustain the oscillation. The LC tank resonator 226 comprises the inductor L1 (230), fixed capacitor C1 (234), and variable capacitor Cv 238. LC tank 226 is driven by the VCO core 214 which excites the LC tank 226 by injecting energy to replace energy dissipated by the finite tank Q and so maintains the oscillation.

In various embodiments, the physical clock-distribution network may be as simple as point-to-point wiring or as complex as a hierarchical system of buffers and wiring distributed at various locations across an electronic circuit. In the case of the FIG. 2A system, the clock distribution system comprises a single buffer 242 and some parasitic wiring capacitance 262. In the FIG. 2A embodiment, LC tank 226 provides two differential signals (tank signal 218 and inverted tankb signal 222) to buffer 242. In alternate embodiments, various other types of VCO output signals are also contemplated. For example, a single non-differential VCO output signal may potentially be utilized.

In the FIG. 2A embodiment, a clock load 270 (one or more functional blocks) is shown with an effective clock load capacitance 258 shown as $C'_L$ which includes the load capacitance $C_L$ 266 and parasitic wiring capacitances $C_p$ 262. In the FIG. 2A embodiment, the clock load 270 receives a clk signal 250 and an inverted clkb signal 254 from the buffer 242.

In the FIG. 2A embodiment, buffer 242 provides the following advantages: 1). Buffer 242 provides reverse isolation between various functional blocks and the clock generator. Disturbances from one functional block may inject noise into the clock wiring and so cause phase noise or jitter in the universal clock that adversely degrades system performance, 2). Buffer 242 allows the regeneration of the clock signal.

Large parasitic capacitances associated with extensive wiring may cause clock rise and fall times to increase and, in extreme cases, may cause the clock high and low logic levels to be reduced, 3). Buffer 242 allows clock skew between clocks at different locations to be tuned.

However, buffer 242 is also associated with the following negative characteristics: 1). Power consumed by the buffer 242 to drive the parasitic wiring capacitance 262 may be significant when compared to the power consumed by a host electronic circuit as a whole, 2). When absolute timing accuracy is required, buffer 242 may add additional timing uncertainty or jitter when the clock signal is received at the CLK load 270. A more detailed embodiment for implementing buffered clock circuit 210 is shown below in conjunction with FIG. 2B.

Figure 2B:
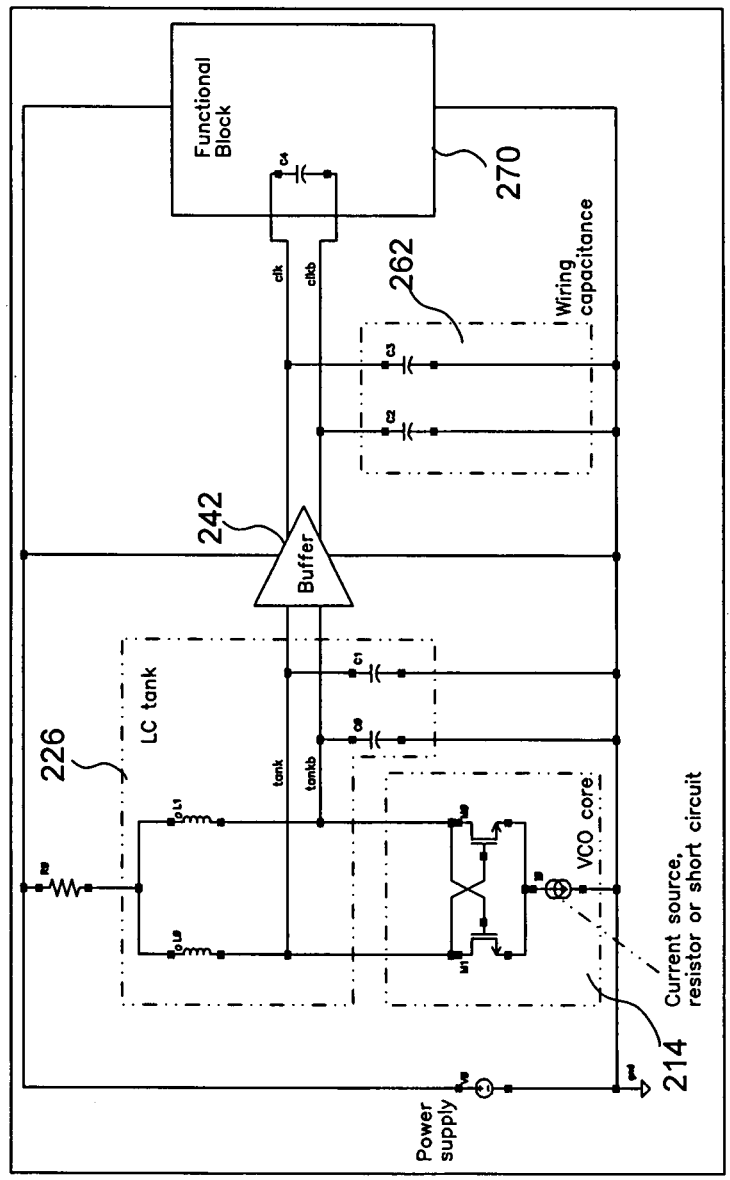
FIG. 2B is a schematic diagram for an alternate embodiment of the buffered clock circuit of FIG. 2A.

Referring now to FIG. 2B, a schematic diagram for a more detailed embodiment 212 of the FIG. 2A buffered clock circuit 210 is shown. The FIG. 2B embodiment is presented for purposes of illustration, and in alternate embodiments, the present invention may utilize clock distribution circuits that include components and configurations in addition to, or instead of, certain of those components and configurations discussed in conjunction with the FIG. 2B embodiment.

In the FIG. 2B embodiment, the numbered components correspond to those identically numbered components shown in the FIG. 2A embodiment. For example, VCO core 214 of the FIG. 2B embodiment provides a more detailed schematic diagram of one embodiment for implementing the VCO core 214 of the FIG. 2A embodiment. In addition, in the FIG. 2B embodiment, LC tank 226 comprises the inductors L0 and L1, and the capacitors C0 and C1. These capacitors C0 and C1 may comprise a fixed element and a variable element. Additional embodiments for implementing clock distribution circuits are further discussed below in conjunction with FIGS. 3 and 4.

Figure 3:
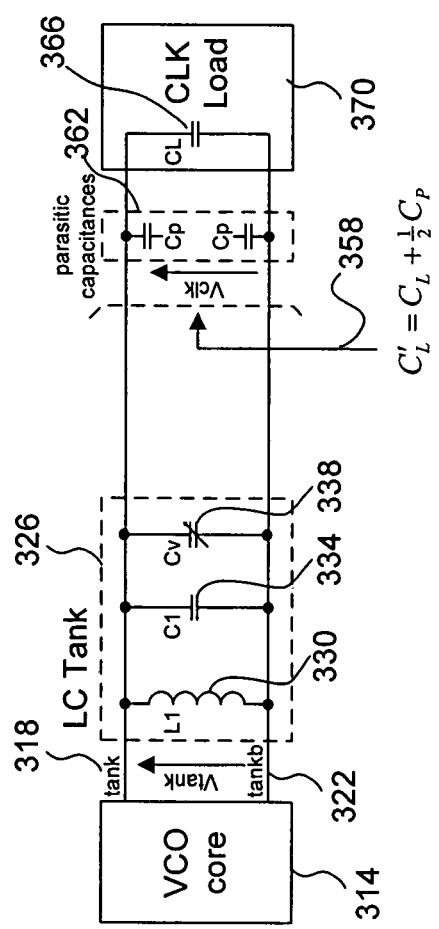
FIG. 3 is a schematic diagram for one embodiment of a DC-coupled direct-drive clock circuit.

Referring now to FIG. 3, a schematic diagram for one embodiment of a DC-coupled direct-drive clock circuit 310 is shown. In the FIG. 3 embodiment, DC-coupled direct-drive clock circuit 310 includes, but is not limited to, a clock generator (VCO core 314 plus LC tank 326), certain parasitic elements 362 associated with wiring over some distance, and a clock (CLK) load 370. In alternate embodiments, DC-coupled direct-drive clock circuit 310 may be implemented using components and configurations in addition to, or instead of, certain of those components and configurations discussed in conjunction with the FIG. 3 embodiment.

In certain embodiments, some electronic components of DC-coupled direct-drive clock circuit 310 may be the same as (or similar to) those corresponding components used to implement the buffered clock circuit 210 of FIGS. 2A and 2B. For example, VCO core 314 may correspond to VCO core 214, LC tank 326 may correspond to LC tank 226, parasitic capacitances 362 may correspond to parasitic capacitances 262, and CLK load 370 may correspond to CLK load 270. However, in the FIG. 3 embodiment, neither buffer 242 nor buffer output signals (clk signal 250 and clkb signal 254) from the FIGS. 2A and 2B embodiments are utilized.

In the FIG. 3 embodiment, eliminating the FIG. 2 buffer 242 removes the additional timing uncertainty generated by buffer noise and also saves significant power. However, the FIG. 3 embodiment has the disadvantage that the clock swing and common mode are set by the VCO (VCO core 314 and LC tank 326) and cannot be easily varied to suit the individual functional blocks. In addition, there is no reverse coupling attenuation, and any disturbance coupled onto the clock line (tank signal 318 or tankb signal 322) directly affects the LC tank 326.

The effective load capacitance $C'_L$ 358 is the same as in the FIG. 2 embodiment. The effect of directly connecting to the LC tank 326 is to reduce the oscillation frequency. To maintain the same oscillation frequency either the value of the other tank capacitors C1 (334) or Cv (338) or the value of the inductor L1 (330) may be reduced. Reducing either or both C1 (334) or Cv (338) may not be possible since these values may already be at their practical limit. Therefore, to maintain clock frequency, the inductance L1 330 should likely be reduced. Reducing the inductance 330 may require a small increase in VCO core current. However, in a well designed system, assuming that the clock distribution network has a moderate Q, this current increase should be considerably smaller than the current saved by removing the buffer 242 of FIG. 2.

It should also be noted that the voltage swing on the tank signal 318 (Vtank) is now the same as the voltage swing at the CLK load 370 (Vclk). To minimize phase noise generated by the VCO, the tank signal voltage swing should be maximized. Ideally, the maximum voltage swing would be close to the voltage supply rails, because this would be the maximum that the active devices can tolerate before the onset of breakdown. However, this maximum voltage swing may conflict with certain types of input circuits in the functional blocks that make up CLK load 370.

In fact, the optimum voltage swing (Vclk) at the CLK load 370 may be considerably less than the full rail swing. Aside from the voltage swing, the Vclk common mode voltage may also be unsuitable for the functional blocks of CLK load 370. For example, the input clock circuits may require Vclk to be 400 mVpp with a common mode voltage that is 300 mV below the positive supply rail. In the arrangement shown in the FIG. 3 embodiment, this stipulation would further reduce the Vtank clock swing and so degrade the phase noise performance.

Therefore, in the FIG. 3 embodiment, a disadvantageous tradeoff is required that balances phase noise versus block performance. In the FIG. 2 embodiment, this tradeoff does not occur because buffer 242 generates an output voltage swing and common mode voltage that are independent of input voltage swing. Thus Vtank may be maximized for noise performance while Vclk may be optimized for block performance. One embodiment for advantageously solving the foregoing clock distribution problems is discussed below in conjunction with FIGS. 4-7.

Figure 4:
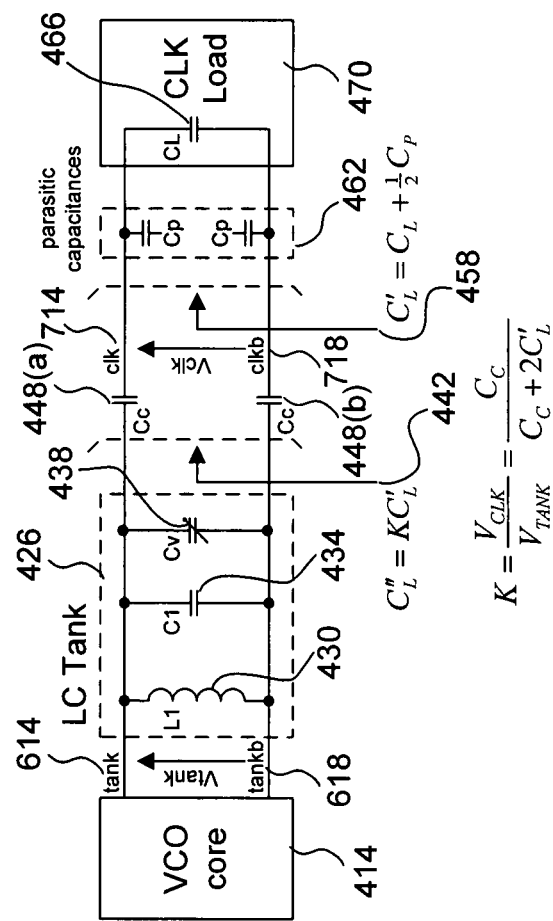
FIG. 4 is a schematic diagram for one embodiment of an AC-coupled direct-drive clock circuit, in accordance with the present invention.

Referring now to FIG. 4, a schematic diagram for one embodiment of an AC-coupled direct-drive clock circuit 410 is shown, in accordance with the present invention. In the FIG. 4 embodiment, AC-coupled direct-drive clock circuit 410 includes, but is not limited to, a clock generator (VCO core 414 plus LC tank 426), two series coupling capacitors Cc 448(*a*) and Cc 448(*b*), certain parasitic capacitances 462 associated with wiring over some distance, and a clock (CLK) load 470. In alternate embodiments, AC-coupled direct-drive clock circuit 410 may be implemented with components and configurations in addition to, or instead of, certain of those components and configurations discussed in conjunction with the FIG. 4 embodiment.

In certain embodiments, some electronic components of AC-coupled direct-drive clock circuit 410 may be the same as (or similar to) those corresponding components used to implement the buffered clock circuit 210 of FIG. 2 and the DC-coupled direct-drive clock circuit 310 of FIG. 3. For example, VCO core 414 may correspond to VCO core 214 and VCO core 314, LC tank 426 may correspond to LC tank 226 and LC tank 326, parasitic capacitances 462 may correspond to parasitic capacitances 262 and parasitic capacitances 362, and CLK load 470 may correspond to CLK load 270 and CLK load 370. For the foregoing reasons, certain comments made above with regard to corresponding components from FIG. 2 or 3 may be applicable to the FIG. 4 embodiment, and are therefore incorporated herein by reference.

The FIG. 4 embodiment differs from the FIG. 2 embodiment primarily because the FIG. 4 embodiment does not utilize buffer 242 of the FIG. 2 embodiment. In addition, the FIG. 4 embodiment differs from the FIG. 3 embodiment primarily because the FIG. 4 embodiment utilizes coupling capacitors 448 that are not present in the FIG. 3 embodiment to couple the LC tank 426 to the CLK load 470. The two series coupling capacitors Cc 448 form a capacitive divider to step down the large tank voltage swing (Vtank) of tank signal 714 and tankb signal 718 to thereby advantageously produce a lesser clock load swing (Vclk) for clk signal 614 and clkb signal 618. A step-down factor K for reducing Vtank to produce Vclk may be expressed by the following equation.

$$K = \frac{V_{CLK}}{V_{TANK}} = \frac{C_C}{C_C + 2C'_L}$$

where $C_c$ is the capacitance of a coupling capacitor 448, $C'_L$ is the effective capacitance 458 of CLK load 470, $V_{CLK}$ is the clk signal voltage swing at CLK load 470, and $V_{TANK}$ is the tank signal voltage swing at LC tank 426.

In the FIG. 4 embodiment, the effective capacitance $C'_L$ 458 of CLK load 470 may be expressed by the following formula:

$$C'_L = C_L + \frac{1}{2}C_P$$

where $C_p$ are parasitic capacitances 462 for the clock signal lines to CLK load 470, and $C_L$ is the actual CLK load capacitance 466 of CLK load 470.

In the FIG. 4 embodiment, the capacitive divider formed by coupling capacitors Cc 448 and effective CLK load capacitance $C'_L$ 458 also serves to reduce, by the factor K, the effective load capacitance that is presented to the LC tank 426. Thus, in the FIG. 3 embodiment, the LC tank 326 sees an additional capacitance of $C'_L$ whereas in the FIG. 4 embodiment, the LC tank 426 sees a smaller additional capacitance $C''_L$ of $K*C'_L$. Therefore, the inductor L1 430 need not be reduced by as much to compensate for the reduction in oscillation frequency.

The LC tank capacitance $C''_L$ of the FIG. 4 embodiment may be expressed by the following formula:

$$C''_L = KC'_L$$

where K is the step-down factor, and $C'_L$ is the effective capacitance 458 of CLK load 470. In the FIG. 4 embodiment, the use of AC coupling allows the clock-load side of the coupling capacitors Cc 448 to have an selectable DC common mode voltage. Therefore the Vclk characteristics may advantageously be specified independently of Vtank.

The FIG. 4 embodiment thus retains the advantages of direct drive including reduced power consumption and reduced timing uncertainty. In addition, the FIG. 4 embodiment also offers the advantages of reducing reverse coupling to LC tank 426, and reducing the effect of the load and distribution capacitances on the oscillation frequency. Furthermore, the FIG. 4 embodiment allows independent control of the clk signal amplitude and common mode voltage.

As discussed above, the inclusion of the AC coupling capacitors Cc 448 creates a capacitive divider that steps down the tank voltage Vtank to produce the clock voltage Vclk. This reduced voltage swing of the clk signal 614 and the clkb signal 618 is more suitable for the functional blocks of CLK load 470. In addition, the AC coupling capacitors 448 allow the clk signal 614 and clkb signal 618 to be set to any arbitrary common mode voltage by utilizing any suitable method. The common mode voltage may be set to be suitable for the functional blocks independent of the VCO core common mode voltage.

In the FIG. 4 embodiment, reverse coupling back into the LC tank 426 is advantageously reduced because any voltage disturbances on the clk line 614 and clkb line 618 are attenuated by the step-down factor K discussed above. The capacitive voltage divider action of the coupling capacitors Cc 448 also reduces the contribution of the effective CLK load capacitance 458 upon the LC tank 426. For all of the foregoing reasons, the FIG. 4 embodiment therefore provides an improved system and method for effectively performing a clock signal distribution procedure.

Figure 5:
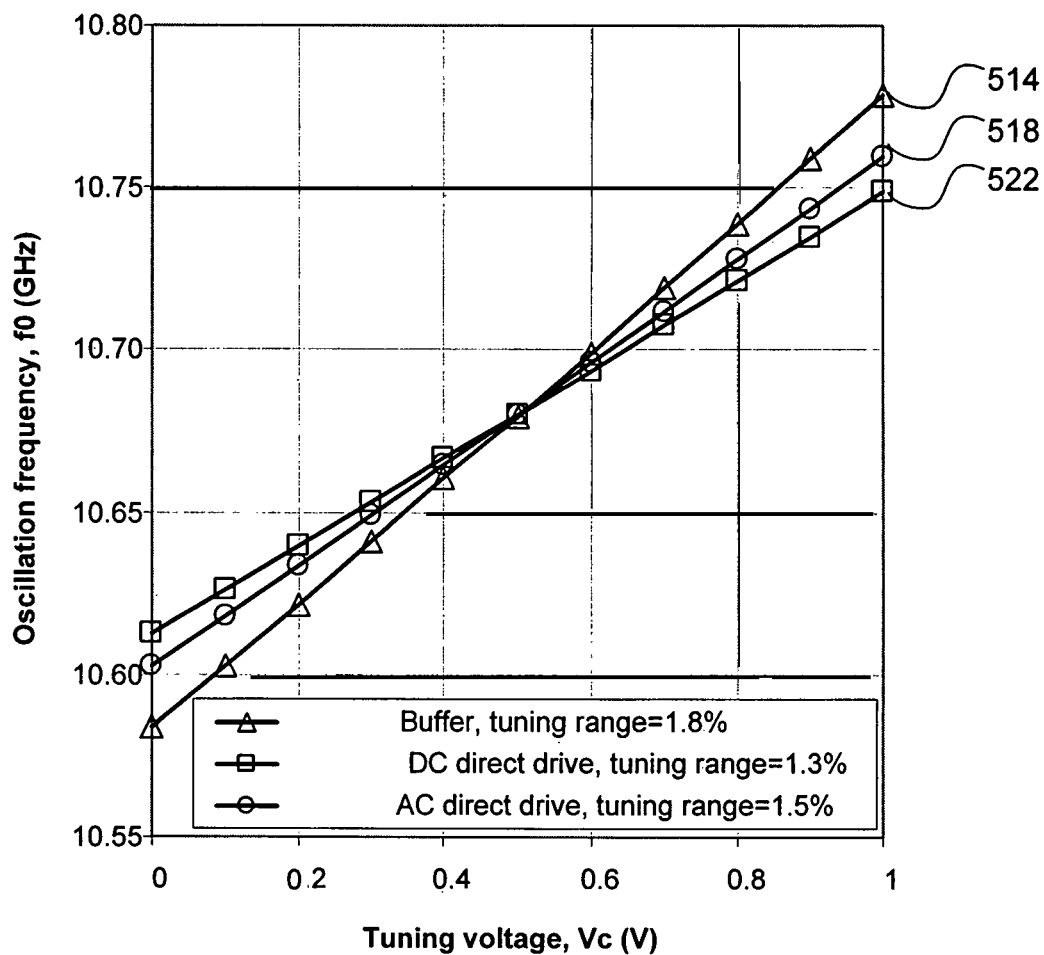
FIG. 5 is a graph showing one embodiment of resonance tuning ranges for the embodiments of FIGS. 2-4.

Referring now to FIG. 5, a graph showing one embodiment of resonance tuning ranges is shown for the embodiments of FIGS. 2-4. The FIG. 5 graph is presented for purposes of illustration, and in alternate embodiments, various tuning ranges may be achieved with configurations and characteristics in addition to, or instead of, certain of those configurations and characteristics discussed in conjunction with the FIG. 5 embodiment.

In the FIG. 5 graph, tuning voltages are presented on a horizontal axis and oscillation frequencies of LC tank 226 (FIG. 2), LC tank 326 (FIG. 3), and LC tank 426 (FIG. 4) are shown on a vertical axis. In the FIG. 5 graph, a tuning range 514 for the FIG. 2 embodiment is marked with small triangles, a tuning range 522 for the FIG. 3 embodiment is marked with small squares, and a tuning range 518 for the FIG. 4 embodiment is marked with small circles.

The ratio of variable capacitance to fixed capacitance in LC tanks 226, 326, and 426 determines the tuning range of the VCO. The VCO requires some method of tuning or varying the output frequency so that the VCO can be synchronized to other systems, and may also cover frequency variations due to process variation and environmental changes. Using the AC direct drive method increases the proportion of fixed capacitance in the LC tank and thus reduces the tuning range compared to a buffer implementation.

The utilization of AC coupling capacitors 448 in the FIG. 4 embodiment reduces the proportion of fixed capacitance (as compared to the FIG. 3 DC direct drive embodiment) by the step-down factor K. Therefore, with all other things being equal, the AC direct drive design of FIG. 4 has a slightly wider tuning range than the DC direct drive design of FIG. 3, but not quite as wide as the buffer version of FIG. 2. In certain embodiments, this reduction in tuning range of the FIG. 4 embodiment may be compensated in other ways, such as by utilizing switched fixed capacitors.

Figure 6:
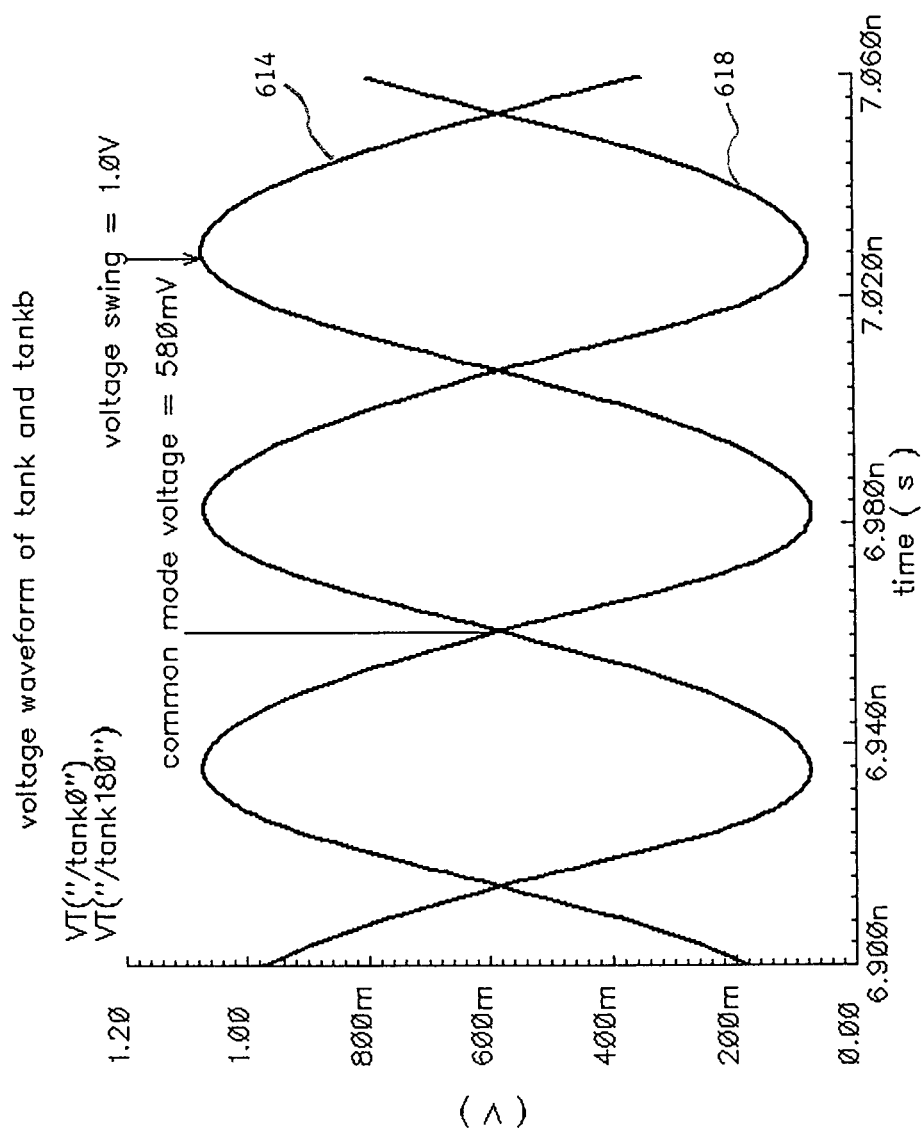
FIG. 6 are waveform diagrams of the tank signal and tankb signal from FIG. 4, in accordance with one embodiment of the present invention.
Figure 7:
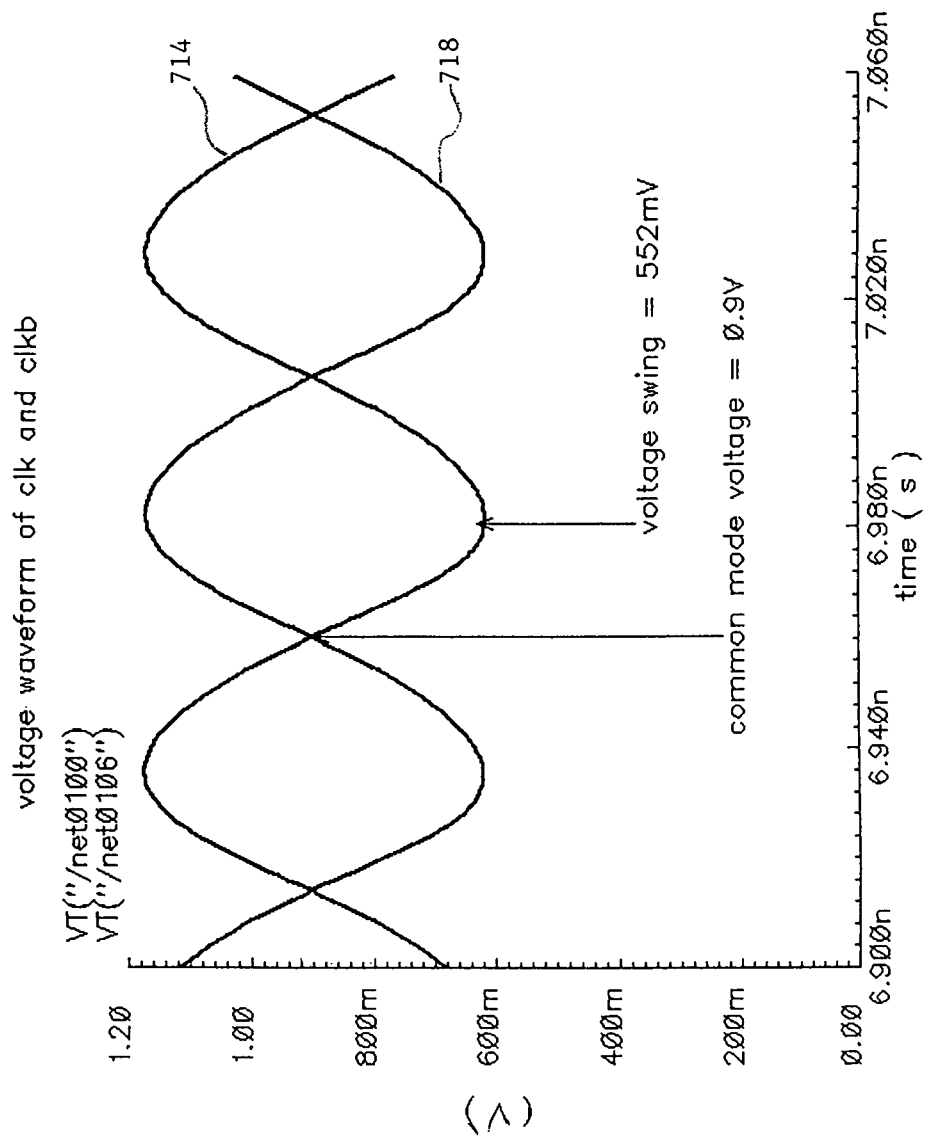
FIG. 7 are waveform diagrams of the clk signal and clkb signal from FIG. 4, in accordance with one embodiment of the present invention.

Referring now to FIG. 6, waveform diagrams of the FIG. 4 tank signal 614 and tankb signal 618 are shown. Referring also to FIG. 7, waveform diagram of the FIG. 4 clk signal 714 and the clkb signal 718 are shown. The waveforms of FIGS. 6-7 are presented for purposes of illustration, and in alternate embodiments, waveform are possible with various characteristics in addition to, or instead of, those characteristics discussed in conjunction with the embodiments of FIGS. 6 and 7.

In the FIG. 6 waveforms, the tank voltages of tank signal 614 and tankb signal 618 are shown with a large voltage swing, approaching the supply rails of 1.2V and 0V. The amplitude of these signals is 1.0Vpp single ended. The crossing point or common mode voltage of these tank voltages is 584 mV. In the FIG. 7 waveforms, the CLK load voltage of clk signal 714 and clkb signal 718 are shown with a smaller amplitude of 550 mVpp single ended with their common mode voltage set to 0.9V. Thus, the FIG. 4 embodiment allows the clock amplitude and common mode voltage to be independently set.

In one embodiment of the FIG. 4 circuit, certain circuit parameters may be approximately equal to the following values:

| | |
|---|---|
| Load capacitance: | $C_L$ = 90 fF |
| Parasitic wiring capacitance: | $C_P$ = 58 fF |
| Effective load capacitance: | $C'_L$ = 119 fF |
| AC coupling capacitance: | $C_C$ = 300 fF |
| Step-down factor: | K = 0.56 |
| Load capacitance seen by tank: | $C''_L$ = 66 fF |
| Other tank capacitors: | $C_1 + C_V$ = 274 fF |
| Total tank capacitance: | $C = C_1 + C_V + C''_L$ = 340 fF |
| Inductance: | $L_1$ = 0.65 nH |
| Oscillation frequency | f = 10.71 GHz |
| Total supply current: | 1.7 mA from a 1.2 V supply |

To put the foregoing supply current into context, consider the theoretical minimum current required to drive a buffer that has a simple RC time constant as its load, where the R is the buffer output impedance and the C is the $C'_L$=119 fF effective load capacitance. The buffer output must swing by 0.55V and have a similar 10% to 90% rise/fall time. The device has a mainly sinusoidal output waveform and so the rise time from 10% of peak amplitude to 90% of peak amplitude is approximately:

$$t_{rise,AC\_DD} = \frac{0.295}{f} = 28 ps$$

The rise time for a simple RC time constant to rise from 10% to 90% is:

$$t_{rise,RC} = RC \cdot \ln\left(\frac{0.9}{0.1}\right) = 2.2 RC$$

Therefore a 28 ps rise time with a 119 fF load capacitance implies a load resistance R of 108 ohms. To swing 0.55V across 108 ohms requires 5.1 mA which is in addition to the VCO core current required for the AC direct drive. This value of 5.1 mA represents a theoretical minimum supply current. For any practical buffer implementation the actual supply current may be much larger as other effects have not been taken into account.

The invention has been explained above with reference to certain embodiments. Other embodiments will be apparent to those skilled in the art in light of this disclosure. For example, the present invention may readily be implemented using configurations and techniques other than those described in the embodiments above. Additionally, the present invention may effectively be used in conjunction with systems other than those described above. Therefore, these and other variations upon the discussed embodiments are intended to be covered by the present invention, which is limited only by the appended claims.

What is claimed is:

1. A system for performing a clock signal distribution procedure, comprising:

a clock generator configured to generate a clock signal that includes electronic timing information to simultaneously control a plurality of different external functional devices that are not integral with said clock generator;

a clock load that utilizes said electronic timing information from said clock signal to synchronize one or more system processes in said plurality of different external functional devices that form said clock load; and capacitive coupling means for transferring said clock signal from said clock generator to said clock load, said capacitive coupling means being positioned external to said clock generator to couple said clock signal directly from said clock generator only to said clock load, said capacitive coupling means being implemented during a design selection procedure with a capacitance that provides said clock signal at an optimal common mode voltage level and an optimal clock signal amplitude that are compatible with said clock load, said clock generator generating one or more tank signals, said capacitive coupling means transferring said tank signals to said clock load as clk signals, said capacitive coupling means being implemented without applying bias voltages to said clk signals.

2. The system of claim 1 wherein said clock generator is implemented as a voltage-controlled oscillator that includes a VCO core and an LC tank.

3. The system of claim 2 wherein said clock signal is generated in a differential configuration that produces a non-inverted clock signal and a corresponding inverted clock signal.

4. The system of claim 2 wherein said clock load includes one or more functional blocks that each utilize said electronic timing information from said clock signal.

5. The system of claim 2 wherein said clock signal distribution procedure is performed without utilizing a buffer device to couple said clock signal from said clock generator to said clock load.

6. The system of claim 2 wherein said capacitive coupling means includes one or more coupling capacitors that are each connected in a series configuration to provide an alternating-current direct-drive for transferring said clock signal from said clock generator to said clock load.

7. The system of claim 6 wherein said coupling capacitors perform reverse isolation functions to isolate said clock generator from noise signals generated by said clock load.

8. The system of claim 6 wherein said LC tank generates said one or more tank signals, said coupling capacitors transferring said tank signals to said clock load as said clk signals.

9. The system of claim 8 wherein said coupling capacitors create a capacitive divider with respect to an effective load capacitance of said clock load, said capacitive divider creating a tank voltage swing of said tank signals that is different from a load voltage swing of said clk signals.

10. The system of claim 9 wherein said effective load capacitance includes parasitic capacitances of connection conductors between said clock generator and said clock load.

11. The system of claim 10 wherein said effective load capacitance C'$_L$ said clock load is expressed by a formula:

$$C'_L = C_L + \frac{1}{2}C_P$$

where $C_p$ are said parasitic capacitances, and $C_L$ is an actual clock load capacitance of said clock load.

12. The system of claim 10 wherein said coupling capacitors create a capacitive divider with respect to said effective load capacitance of said clock load, said capacitive divider creating a tank capacitance at said LC tank that is different from said effective load capacitance of said clock load.

13. The system of claim 12 wherein said tank capacitance C"$_L$ is expressed by a formula:

$$C"_L = KC'_L$$

where K is a step-down factor due to said capacitive divider, and C'$_L$ is said effective load capacitance.

14. The system of claim 13 wherein said step-down factor is expressed by a formula:

$$K = \frac{V_{CLK}}{V_{TANK}} = \frac{C_C}{C_C + 2C'_L}$$

where $C_c$ is a capacitance value of said coupling capacitors, C'$_L$ is said effective load capacitance, $V_{CLK}$ is said clock voltage swing at said clock load, and $V_{TANK}$ is said tank voltage swing at said LC tank.

15. The system of claim 14 wherein said step-down factor quantifies a capacitive variation between said tank capacitance at said LC tank and said effective load capacitance at said clock load.

16. The system of claim 15 wherein said tank capacitance C"$_L$ is expressed by a formula:

$$C"_L = KC'_L$$

where K is said step-down factor, and C'$_L$ is said effective load capacitance.

17. The system of claim 15 wherein said coupling capacitors create a capacitive divider with respect to said effective load capacitance of said clock load, said capacitive divider creating a tank common-mode voltage of said tank signals that is different from a load common-mode voltage of said clk signals.

18. The system of claim 2 wherein said LC tank includes a fixed tank capacitor and a tuning capacitor that is variable for adjusting a clock frequency of said clock signal, said clock frequency having a tuning range that is approximately equal to 1.5 percent.

19. The system of claim 2 wherein said clock generator includes a feedback loop from said LC tank to said VCO core, said capacitive coupling means being positioned external to said feedback loop to couple said clock signal directly from said clock generator only to said clock load.

20. The system of claim 9 wherein a capacitance value of said capacitive coupling means is selected to match said load voltage swing of said clk signals to an optimal operating voltage of said plurality of different external functional devices that form said clock load.

21. The system of claim 8 wherein said capacitive coupling means is implemented without applying any externally-generated direct-current bias voltages to said clk signals.

22. A method for performing a clock signal distribution procedure, comprising the steps of:
generating a clock signal with a clock generator, said clock signal including electronic timing information to simultaneously control a plurality of different external functional devices that are not integral with said clock generator;
providing a clock load that utilizes said electronic timing information from said clock signal to synchronize one or more system processes in said plurality of different external functional devices that form said clock load; and
transferring said clock signal from said clock generator to said clock load through capacitive coupling means, said capacitive coupling means being positioned external to said clock generator to couple said clock signal directly from said clock generator only to said clock load, said capacitive coupling means being implemented during a design selection procedure with a capacitance that provides said clock signal at an optimal common mode voltage level and an optimal clock signal amplitude that are compatible with said clock load, said clock generator generating one or more tank signals, said capacitive coupling means transferring said tank signals to said clock load as clk signals, said capacitive coupling means being implemented without applying bias voltages to said clk signals.

23. A device for performing a clock signal distribution procedure, comprising:
means for generating a clock signal that includes electronic timing information to simultaneously control a plurality of different external functional devices that are not integral with said means for generating;
means for utilizing said electronic timing information from said clock signal to synchronize one or more system processes in said plurality of different external functional devices that form said means for utilizing; and
means for transferring said clock signal from said means for generating to said means for utilizing, said means for transferring being positioned external to said means for generating to couple said clock signal directly from said means for generating only to said means for utilizing, said means for transferring being implemented during a design selection procedure with a capacitance that provides said clock signal at an optimal common mode voltage level and an optimal clock signal amplitude that are compatible with said means for utilizing, said means for generating producing one or more tank signals, said capacitive coupling means transferring said tank signals to said clock load as clk signals, said means for transferring being implemented without applying bias voltages to said clk signals.

* * * * *